(12) United States Patent
Sugihara et al.

(10) Patent No.: US 6,392,293 B2
(45) Date of Patent: May 21, 2002

(54) SEMICONDUCTOR PACKAGE WITH SLOPED OUTER LEADS

(75) Inventors: Koichi Sugihara, Oita; Koichi Miyashita, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/324,774

(22) Filed: Jun. 3, 1999

(30) Foreign Application Priority Data

Jun. 4, 1998 (JP) .......................................... 10-155950

(51) Int. Cl.[7] .............................................. H01L 23/48
(52) U.S. Cl. .................. 257/690; 257/665; 257/666; 257/672; 257/673; 257/692; 257/693; 257/696
(58) Field of Search .................................. 257/665, 666, 257/672, 690, 693, 696, 673, 692

(56) References Cited

U.S. PATENT DOCUMENTS

| | | | |
|---|---|---|---|
| 3,179,913 A | 4/1965 | Mittler et al. ................. | 339/18 |
| 3,370,203 A | 2/1968 | Kravitz et al. .............. | 317/101 |
| 3,459,998 A | 8/1969 | Focarile ....................... | 317/100 |
| 3,904,934 A | 9/1975 | Martin ........................ | 317/101 |
| 4,288,841 A | 9/1981 | Gogal ......................... | 361/414 |
| 4,502,098 A | 2/1985 | Brown et al. ............... | 361/383 |
| 4,574,331 A | 3/1986 | Smolley ...................... | 361/393 |
| 4,646,128 A | 2/1987 | Carson et al. ............... | 357/74 |
| 4,670,770 A * | 6/1987 | Tai .............................. | 257/665 |
| 4,727,410 A | 2/1988 | Higgins, III ................. | 357/74 |
| 4,823,233 A | 4/1989 | Brown et al. ............... | 361/383 |
| 4,833,568 A | 5/1989 | Berhold ....................... | 361/383 |
| 4,862,249 A | 8/1989 | Carlson ....................... | 357/80 |
| 4,868,712 A | 9/1989 | Woodman .................... | 361/388 |
| 4,953,005 A | 8/1990 | Carlson et al. .............. | 357/80 |
| 5,016,138 A | 5/1991 | Woodman .................... | 361/381 |
| 5,019,945 A | 5/1991 | Smolley ...................... | 361/412 |
| 6,046,501 A1 * | 4/2001 | Ishikawa et al. | |

OTHER PUBLICATIONS

Susumu Kohyama et al.; (eds.), ASIC Packaging Technology Handbook, Science Forum Inc., Dec. 25, 1992, pp. 5–13 and 205–209.

* cited by examiner

*Primary Examiner*—Fetsum Abraham
(74) *Attorney, Agent, or Firm*—Finnegan, Henderson, Farabow, Garrett, & Dunner, L.L.P.

(57) ABSTRACT

Outer leads extend outward from within a package that seals a semiconductor chip, and they are connected to the semiconductor chip inside the package. Depressions are formed at the distal end portions of the outer leads. The depressions are coated with a material which is one of: Sn—Pb, Sn—Ag, Sn—Bi, Sn—Zn, Sn—Cu, Pd, Au and Ag. The depressions are V-shaped, U-shaped, or rectangular. Each depression has a depth which is 30% to 75% with respect to the thickness which the outer lead has at the cut end face of distal end thereof. The outer leads are either a gull-wing type or a straight type.

5 Claims, 11 Drawing Sheets

SEMICONDUCTOR PACKAGE WITH SLOPED OUTER LEADS

BACKGROUND OF THE INVENTION

In general, in the conventional art, the outer leads of a semiconductor device and the wiring portions of a circuit board are bonded together by soldering. A conventional semiconductor device having conventional gull-wing and straight outer leads and a manufacturing method of such a semiconductor device are described, for example, in Susumu Kohyama et al. (eds.), ASIC Packaging Technology Handbook, Science Forum Inc., pp. 206–209.

In order to strengthen the bond between the outer leads of a semiconductor device and the circuit board on which it is mounted, and to thereby ensure reliable connection, it is necessary to provide a large solder fillet. The "solder fillet" is a solder portion rising from the surface of the wiring portion toward the outer lead. Since the size of the solder fillet is dependent on the electrode area of the board, it is required that that electrode area be as great as possible. At the same time, however, there is a demand for higher integration density and the use of a larger number of pins. To prevent the adjacent electrodes from short-circuiting due to the solder provided, the intervals at which the electrodes are arranged must be greater than a certain distance, and the electrodes are not allowed to have sufficient dimensions in the width direction of the outer leads. In general, therefore, the electrodes are designed to have substantially the same widths as the outer leads and to have sufficient dimensions in the longitudinal direction of the outer leads, since the electrodes of this structure enable the required solder fillets to be provided.

For the reasons given above, a solder fillet is not formed in the regions on the side of the solder portion of the outer leads since the electrodes formed on the board are not allowed to have sufficient space in those regions. Therefore, in the case of a QFP (Quad Flat Package) type, a SOP (Small Outline Package) type or another type of semiconductor device having gull wing-shaped outer leads, each outer lead has only two solder portions: one is the distal end and the other is the proximal end. In general, the solder fillet at the distal end of a lead is referred to as a front fillet, while that at the proximal end thereof is referred to as a back fillet.

The conventional art will be described with reference to FIGS. 1A–1D, FIGS. 2A–2E and FIGS. 3–6. FIGS. 1A–1D show a first example of a manufacturing process of a conventional QFP or SOP type semiconductor device. As shown in FIG. 1A, a resin-molded semiconductor package 101 has an outer lead 102 extending in the horizontal direction, and the distal end of that outer lead is connected to the outer frame (not shown) of a lead frame.

As shown in FIG. 1B, a solder plating 103 is provided on the surface of the outer lead 102 by electroplating, for example.

Next, the distal end portion of the outer lead 102 is cut off to disconnect the semiconductor package 101 from the lead frame, as shown in FIG. 1C. Further, the outer lead is bent by means of a punch, as shown in FIG. 1D.

FIGS. 2A–2E show a second example of a manufacturing process of a conventional QFP or SOP type semiconductor device. Like the example shown in FIG. 1A, a semiconductor package 101 has an outer lead 102.

As shown in FIG. 2B, a solder plating 103 is provided on the surface of the outer lead 102 by electroplating, for example. Next, the distal end portion of the outer lead 102 is cut off to disconnect the semiconductor package 101 from the lead frame, as shown in FIG. 1C. At the time, the outer lead 102 extending from the package 101 is made to include an auxiliary portion; in other words, the length of the outer lead 102 that remains after cutting is slightly greater than the final length. The outer lead 102 is cut by the shearing stress that is applied thereto when a cut punch is moved downward. Thereafter, the outer lead is bent in the manner shown in FIG. 2D. Finally, the distal end portion of the outer lead 102 is cut off again, as shown in FIG. 2E.

Each of the outer leads 102 of the conventional QFP or SOP type semiconductor device worked as above has such a distal end as is shown in FIG. 3. As shown, the distal end has a cut face formed in the lead cutting process. To improve the solder characteristics, the outer lead 102 is normally provided with an outer sheath, and a typical method used for this purpose is electroplating, in which current flows through the frame. It should be noted that the outer lead 102 cannot be provided with a solder plating layer unless it is electrically connected to the lead frame. Therefore, the solder plating process must be executed before the distal end portion of each outer lead is cut off. As can be seen from this, the cut face at the distal end of each outer lead 102 of the conventional QFP or SOP type semiconductor device is not provided with a plating layer, as shown in FIG. 3.

When the outer leads are soldered to the board, the cut face at the distal end of an outer lead is not covered with a soldering material. As shown in FIG. 4, the front fillet 104 is, at the highest, half the thickness of the outer lead.

In the examples given above, the distal ends of the outer leads are cut in a direction that prevents the resultant burrs from protruding toward the surface of the board. Unless the distal ends of the outer leads are cut in such a direction, the front fillet 104 described above cannot be formed.

If the solder fillet is less than half the thickness of an outer lead, it is not possible to provide sufficient bonding strength. In the conventional QFP or SOP type, therefore, most of the bonding strength with reference to the board is dependent only on the back fillet 104'. However, in the case of a semiconductor device which must undergo complex stress, as at the time when a temperature cycle test is executed, the bonding strength based only on the back fillet 104' is not considered reliable.

Visual inspection, by which to check whether sufficient solder fillets have been formed and whether soldering has been completed in a desirable manner, is normally executed by observing the devices on the board from above through a microscope. However, since the back fillets 104' are blocked from view due to the outer leads 102 when observation is made in this direction, only the shapes of the front fillets 104 are observed in the visual inspection, and judgment is made based on them. As shown in FIG. 4, however, the front fillets 104 are small in the case of the conventional QFP or SOP type, so that the visual inspection is not easy and requires a long time.

As shown in FIG. 5, an SON (Small Outline Non Leaded Package) is one type of packages having straight outer leads. Due to the structural features, no back fillets 104' are not formed in the case of the SON, as can be seen from FIG. 6. In addition, the fillets 104 at the distal ends of the leads are not sufficient to provide reliable bonding, for the same reasons as described above in regard to the QFP and SOP type. In the case of the SON type semiconductor device, wherein no back fillets are formed, the insufficient front fillets 104 become a cause of unreliable bonding strength. The conventional SON structure is not applicable to a semiconductor device that is required of high reliability.

In regard to the SON structure, it should be noted that the amount of solder used for forming the fillets is small in comparison with the case of QFP or SOP type. In particular, if the front fillets 104 are small in size, all solder paste coated on the electrodes on the board may not be used, resulting in short-circuiting between the adjacent electrodes.

BRIEF SUMMARY OF THE INVENTION

The present invention has been made in due consideration of the above problems, and the object of the invention is to provide a semiconductor device which enables formation of sufficient front fillets, reliable bonding strength with reference to electrodes on a board, and easy visual inspection.

According to the present invention, this object is achieved by providing a semiconductor device, comprising: means for providing outer leads which extend outward from within a package that seals a semiconductor chip and which are connected to the semiconductor chip inside the package; means for forming depressions in the distal end portions of the outer leads; and means for coating the depressions with one material selected from the group including Sn—Pb, Sn—Ag, Sn—Bi, Sn—Zn, Sn—Cu, Pd, Au and Ag.

With this structure, the semiconductor device can be reliably soldered to a circuit board, both front and back solder fillets can be formed on the wiring electrodes and outer leads in an optimal manner, and the electric and mechanical connections are therefore very reliable.

According to the present invention, there is also provided a semiconductor device-manufacturing method comprising the steps of: providing outer leads which extend outward from within a package that seals a semiconductor chip and which are connected to the semiconductor chip inside the package; forming depressions in those portions of the outer leads which are to become distal end portions after the outer leads are cut; executing one of electrolytic plating, electroless plating, hot dipping and deposition with respect to the outer leads; and cutting off distal ends of the outer leads such that the depressions are partly left in cut end faces of the outer leads.

Owing to the above steps, the semiconductor device can be reliably soldered to a circuit board, both front and back solder fillets can be formed on the wiring electrodes and outer leads in an optimal manner, and the electric and mechanical connections are therefore very reliable.

According to the present invention, there is further provided a semiconductor device-manufacturing method comprising the steps of: providing outer leads which extend outward from within a package that seals a semiconductor chip and which are connected to the semiconductor chip inside the package; executing one of electrolytic plating, electroless plating, hot dipping and deposition with respect to the outer leads; forming depressions in those portions of the outer leads which are to become distal end portions of the outer leads after the outer leads are cut; and cutting the distal end portions of the outer leads such that the depressions are partly left in cut end faces of the outer leads.

Owing to the above steps, the solder characteristics of the outer leads are improved, and solder fillets can be formed on the electrodes on the circuit board in an optimal manner, thus enhancing the reliability. In addition, the cut positions can be determined with a high degree of freedom.

According to the present invention, there is further provided a semiconductor device-manufacturing method comprising the steps of: providing outer leads which extend outward from within a package that seals a semiconductor chip and which are connected to the semiconductor chip inside the package; executing one of electrolytic plating, electroless plating, hot dipping and deposition with respect to the outer leads; cutting the outer leads; working the outer leads to have a predetermined shape; forming depressions in the outer leads; and cutting the outer leads at positions corresponding to the depressions.

Owing to the above steps, the solder characteristics are improved, and solder fillets can be formed on the outer leads at both the front and back positions, thus enhancing the reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described in detail, referring to some embodiments thereof. It should be noted, however, that the present invention is not limited to the described embodiments and can be modified in various manners when it is reduced to practice.

A description will be given with reference to the accompanying Figures as to how outer leads of the semiconductor devices of embodiments of the present invention are manufactured.

Figure 7A:
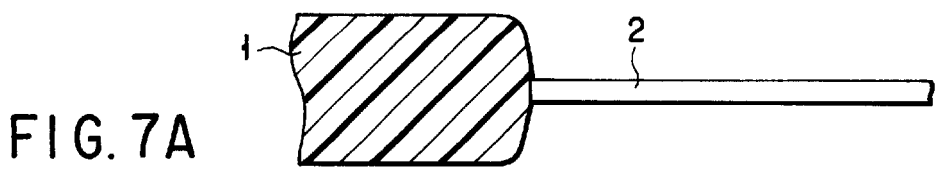
FIGS. 7A–7E are sectional views illustrating a manufacturing process in which a QFP or SOP type semiconductor device is manufactured according to the first embodiment of the present invention.

First of all, the first embodiment of the present invention will be described with reference to FIGS. 7A to 7E. After being sealed as a semiconductor package, the structure shown in FIG. 7A is obtained. As shown in this Figure, each outer lead 2 extends in the widthwise direction of a semiconductor package 1 and is connected to the outer frame (not shown) of a lead frame. The structure shown in FIG. 7A is obtained by executing a resin mold step, using an ordinary plastic material. The package 1 need not be necessarily a synthetic resin mold; it may be formed of a ceramic material. Inside the semiconductor package 1, a semiconductor chip is arranged. Although not shown, bonding pads formed thereon are connected to inner leads extending inside the package 1 by wire bonding, for example. The inner leads are continuous to the outer leads 2. The thickness of the outer leads 2 is normally within the range of 0.125 to 0.4 mm, and the material thereof is an alloy using Cu as its base, or a "42 alloy" (an alloy consisting of 42% by weight of Ni and 58% by weight of Fe).

Figure 7B:
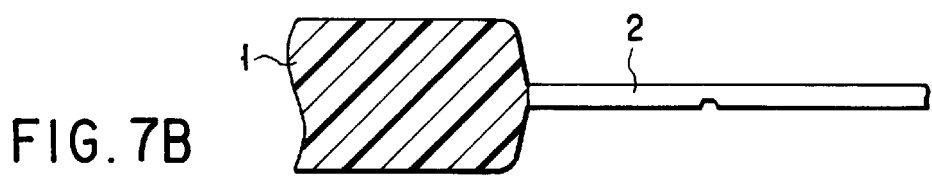

As shown in FIG. 7B, a depression 11 is formed in each outer lead 2 by coining, etc. The depression 11 need not have a special shape; it may be U-shaped, V-shaped or rectangular. The depression 11 may be formed in the upper portion and/or the lower portion of the outer lead 2. FIG. 7B shows the case where it is formed in the lower portion of the outer lead 2. The depression may be formed either by mechanical working (e.g., coining) or by chemical working (e.g., etching).

Figure 7C:
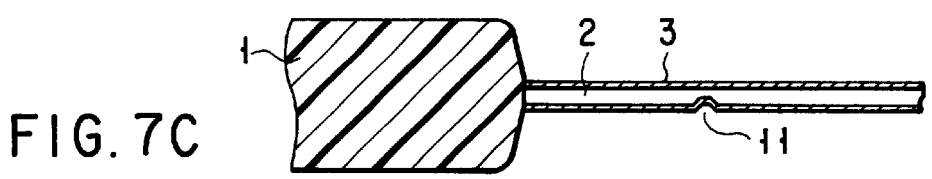

Next, electroplating is performed with respect to each outer electrode 2, as shown in FIG. 7C. The electroplating is specifically solder plating using SnPb, SnAg, SnBi, Snzn, or the like. The thickness of the plating layer can be arbitrarily determined, but is preferably 10 $\mu$m or so. The plating layer may be of a three-layer structure made up of: a Pd layer having Ni base; a Pd layer formed on the Pd layer; and an Au layer formed on the Pb layer. To improve the soldering characteristics, it is possible to use Sn—Pb, Sn—Ag, Sn—Bi, Sn—Zn, Sn—Cu, Pd, Au, Ag, etc.

Figure 7D:
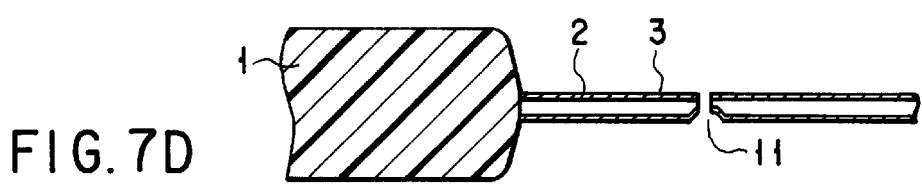
Figure 7E:
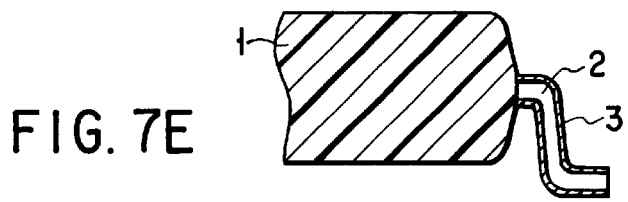

Next, as shown in FIG. 7D, the outer lead 2 is cut in such a manner that the depression 11 formed therein is located at the distal end of the remaining portion of the outer lead 2. Subsequently, the lead is bent to have a predetermined shape, as shown in FIG. 7E. The solder coating surface at the distal end of the outer end constitutes a slanted face looking like a chamfer if the depression 11 is V-shaped, and constitutes a stepped surface if it is rectangular.

The step for forming the depression 2 in the outer lead 2 and the step for providing solder plating need not be executed after the resin molding (FIG. 7A). Those steps may be executed, for example, before the semiconductor chip is mounted, as will be described in connection with another embodiment.

After execution of the steps described above, at least part of the cut face at the distal end of an outer lead 2, which extends outward from within the sealing resin 1 for sealing the semiconductor chip and which is electrically connected to the semiconductor chip inside the sealing resin, is coated with a solder plating layer 3, and this layer is formed of a material that improves soldering characteristics. By use of the first embodiment described above, the semiconductor device can be reliably soldered to a circuit board, both front and back solder fillets can be formed on the wiring electrodes and outer leads in an optimal manner, and the electric and mechanical connections are therefore very reliable.

Figure 8A:
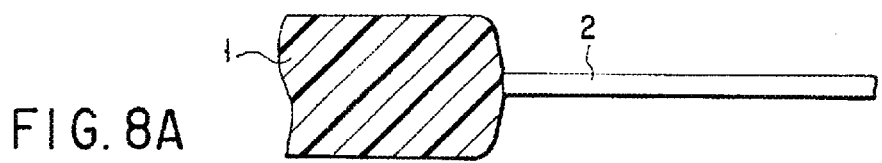
FIGS. 8A–8F are sectional views illustrating a manufacturing process in which a QFP or SOP type semiconductor device is manufactured according to the second embodiment of the present invention.
Figure 8B:
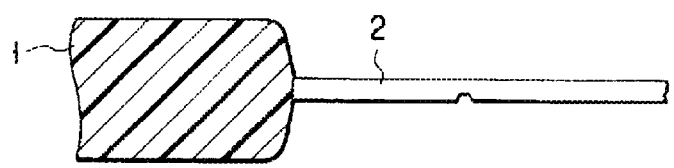

Next, a description will be given of the second embodiment of the present invention with reference to FIGS. 8A–8F. As shown in FIG. 8A, an outer lead 2 extends from a semiconductor package 1. A depression 11 is formed in the outer lead 2 by coining or another suitable means, as shown in FIG. 8B. The depression 11 need not have a special shape; it may be U-shaped, V-shaped or the like.

Figure 8C:
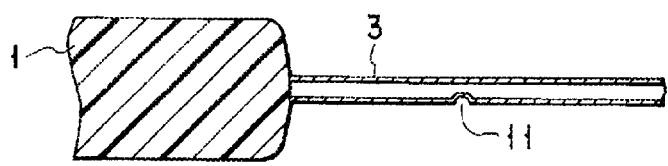
Figure 8D:
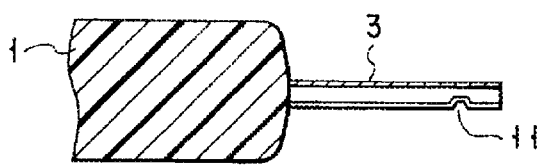
Figure 8E:
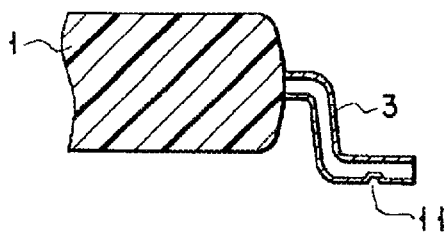
Figure 8F:
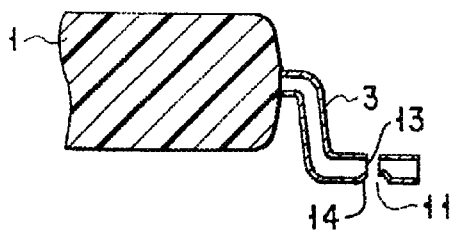

Next, Pd plating or solder plating 3 is provided on the surface of the outer lead 2, as shown in FIG. 8C. The outer lead 2 is cut at a position which is somewhat more away from the package 1 than the depression 11, as shown in FIG. 8D. Then, the lead is bent to have a predetermined shape, as shown in FIG. 8E. Finally, the lead is cut in such a manner that the depression 11 is located at the distal end of the remaining portion of the lead, as shown in FIG. 8F. That is, the distal end of the lead 2 includes a cut surface 13 approximately perpendicular to a longitudinal direction thereof, which is not covered with the solder planting layer 3, and a sloped surface 14 sloped with respect to the longitudinal direction thereof, which is covered with the solder plating layer 3. The plating layer need not be limited to the Pd plating or solder plating described above; it may be formed of any material as long as it improves the soldering characteristics. In addition, the depression 11 may be formed either by mechanical working (e.g., coining) or by chemical working (e.g., etching). By use of the second embodiment described above, the soldering characteristics are improved in the reflow step executed for mounting the semiconductor on a circuit board, a solder fillet can be formed at the front and back portions of an outer lead in an optimal manner, thereby improving reliability. Since a cutting step is executed twice according to the second embodiment, the cutting position can be determined with a high degree of freedom at the time of design. This helps improve the mechanical precision of the product.

Figure 9A:
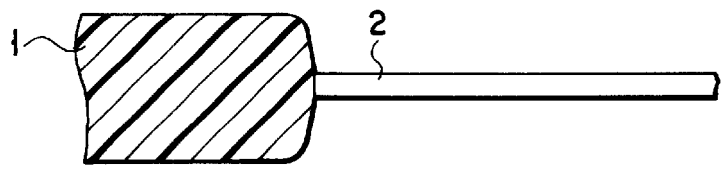
FIGS. 9A–9E are sectional views illustrating a manufacturing process in which a QFP or SOP type semiconductor device is manufactured according to the third embodiment of the present invention.
Figure 9B:
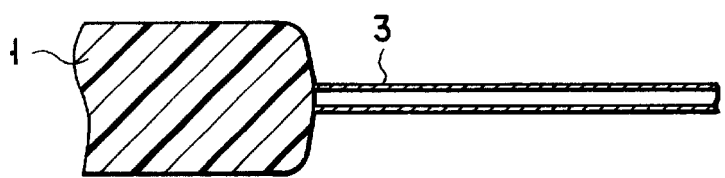
Figure 9C:
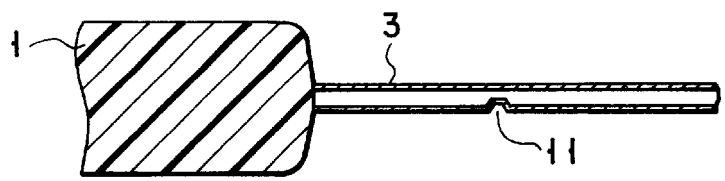
Figure 9D:
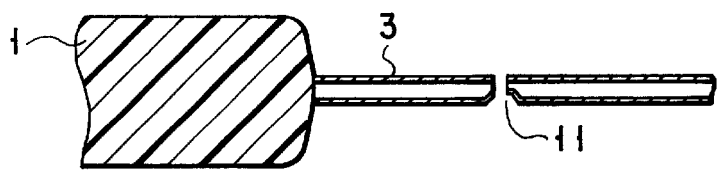
Figure 9E:
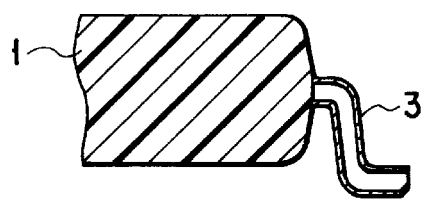

A description will now be given of the third embodiment of the present invention with reference to FIGS. 9A to 9E. As shown in FIG. 9A, a structure comprising a semiconductor package 1 and an outer lead 2 is prepared by use of an ordinary semiconductor device-manufacturing method. Next, solder plating 3, such as Pd plating, is provided on the surface of the outer lead 2 by electroplating, as shown in FIG. 9B. Subsequently, a depression 11 is formed in the outer lead 2 by coining or another suitable means, as shown in FIG. 9C. The depression 11 need not have a special shape; it may have a U-shape, a V-shape or any other shape desired. Next, the outer lead 2 is cut in such a manner that the depression 11 is located at the distal end of the remaining portion of the lead, as shown in FIG. 9D. Thereafter, the lead is bent to have a predetermined shape, as shown in FIG. 9E. The third embodiment differs distinctly from the first and second embodiments in that the depression 11 is formed after the plating is provided on the surface of the outer lead 2. By use of the third embodiment, improved soldering characteristics are ensured when the semiconductor device is mounted on a circuit board, and reliable soldering operations can therefore be performed.

Figure 10A:
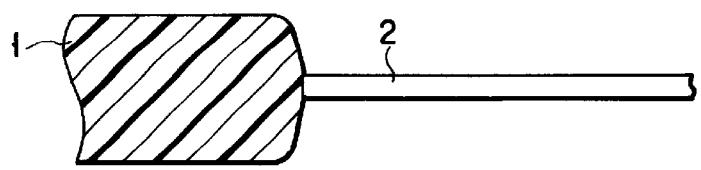
FIGS. 10A–10F are sectional views illustrating a manufacturing process in which a QFP or SOP type semiconductor device is manufactured according to the fourth embodiment of the present invention.
Figure 10B:
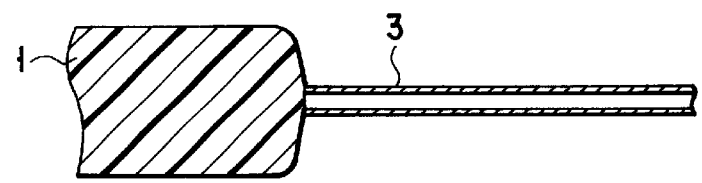
Figure 10C:
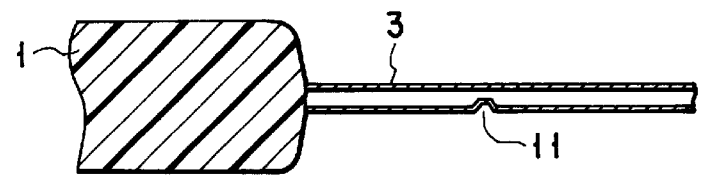
Figure 10D:
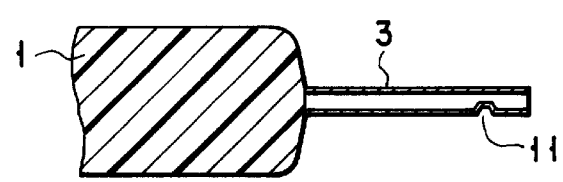
Figure 10E:
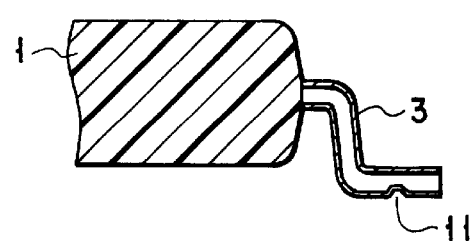
Figure 10F:
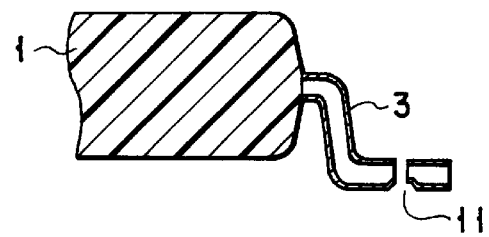

A description will now be given of the fourth embodiment of the present invention with reference to FIGS. 10A to 10F. As shown in FIG. 10A, a structure comprising a semiconductor package 1 and an outer lead 2 is prepared in an ordinary semiconductor device-assembling process. Next, Pd plating, solder plating 3, or the like is provided on the surface of the outer lead 2 by electroplating, as shown in FIG. 10B. Subsequently, a depression 11 is formed in the outer lead 2 by coining or another suitable means, as shown in FIG. 10C. The depression 11 need not have a special shape; it may have a U-shape, a V-shape or any other shape desired. The outer lead 2 is cut at a position which is somewhat more away from the package 1 than the depression 11, as shown in FIG. 10D. Then, the lead is bent to have a predetermined shape, as shown in FIG. 10E. Finally, as shown in FIG. 10F, the lead is cut in such a manner that the depression 11 is located at the distal end of the remaining portion of the lead. By use of the fourth embodiment described above, the soldering characteristics of the outer leads are improved, and a solder fillet can be formed on the electrodes of a circuit board, thereby improving reliability. In addition, since the cutting position can be determined with a high degree of freedom, high-precision of the product is ensured.

Figure 1A:
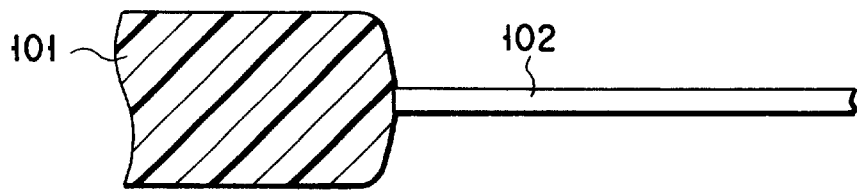
FIGS. 1A–1D are sectional views illustrating an example of a manufacturing process in which a semiconductor device, such as a QFP or SOP type, is manufactured according to the prior art.
Figure 1B:
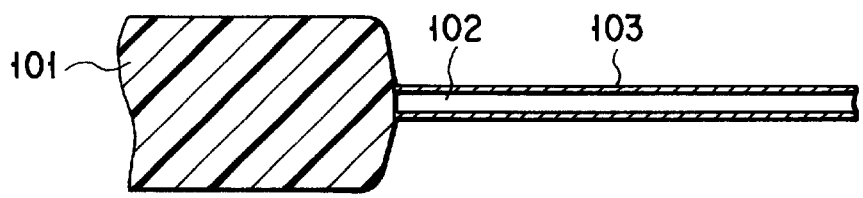
Figure 1C:
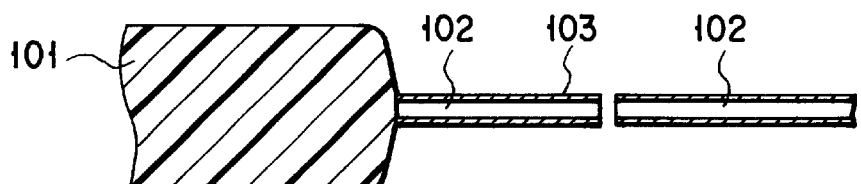
Figure 1D:
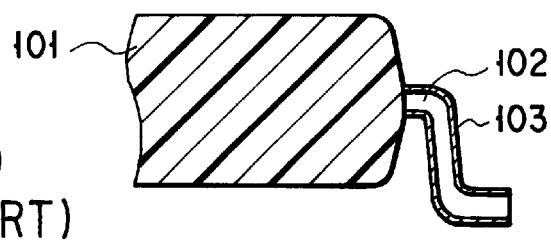
Figure 2A:
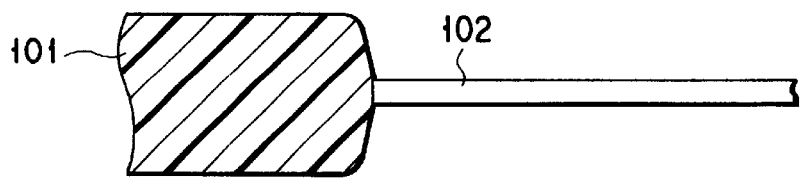
FIGS. 2A–2E are sectional views illustrating an example of a manufacturing process in which a semiconductor device, such as a QFP or SOP type, is manufactured according to the prior art.
Figure 2B:
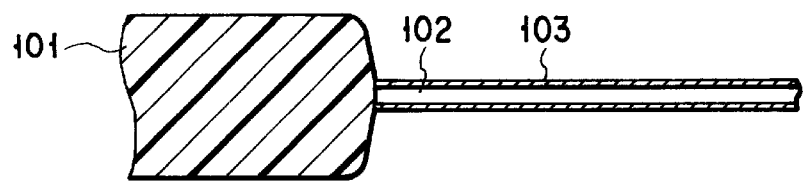
Figure 2C:
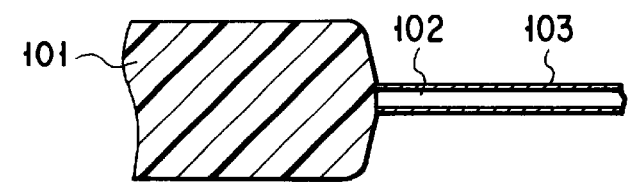
Figure 2D:
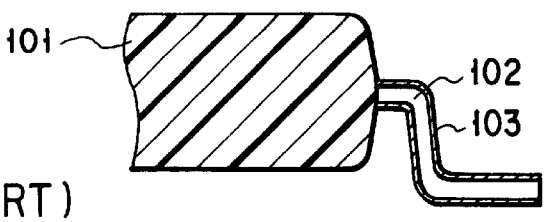
Figure 2E:
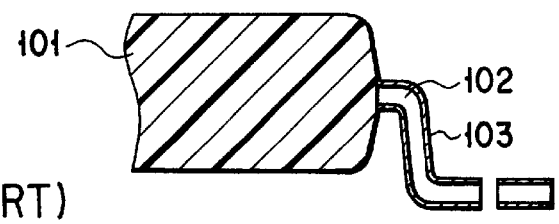
Figure 3:
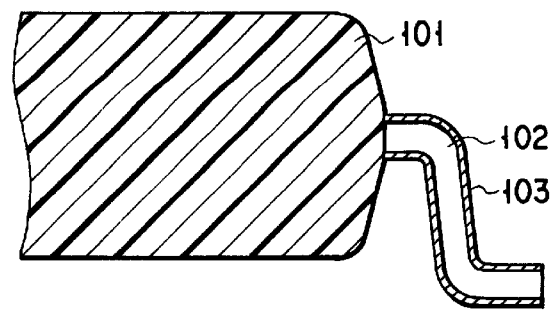
FIG. 3 is a sectional view of a QFP or SOP type semiconductor device according to the prior art.
Figure 4:
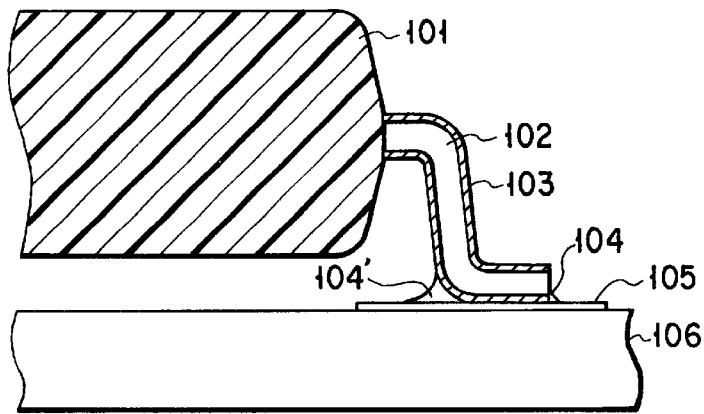
FIG. 4 is a sectional view showing how the QFP or SOP type semiconductor device according to the prior art is mounted on a circuit board.
Figure 5:
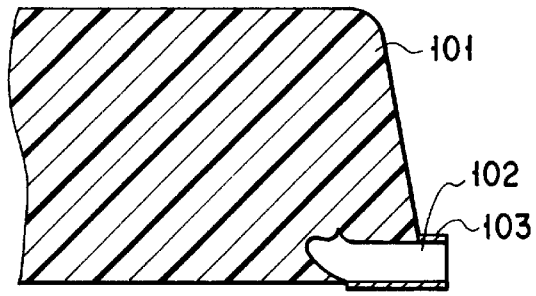
FIG. 5 is a sectional view of a SON type semiconductor device according to the prior art.
Figure 6:
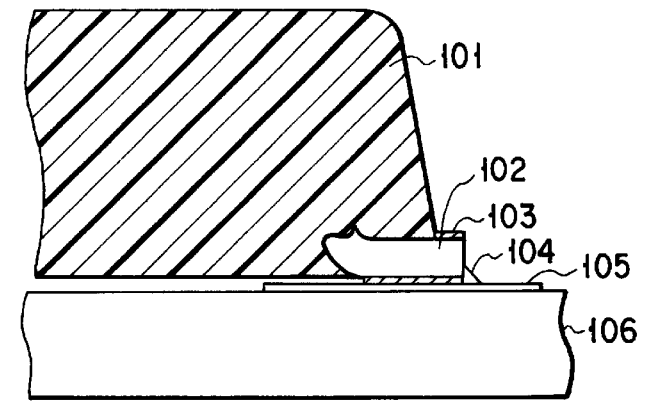
FIG. 6 is a sectional view showing how the SON type semiconductor device according to the prior art is mounted on a circuit board.
Figure 11A:
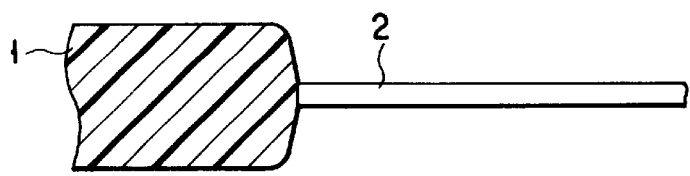
FIGS. 11A–11F are sectional views illustrating a manufacturing process in which a QFP or SOP type semiconductor device is manufactured according to the fifth embodiment of the present invention.
Figure 11B:
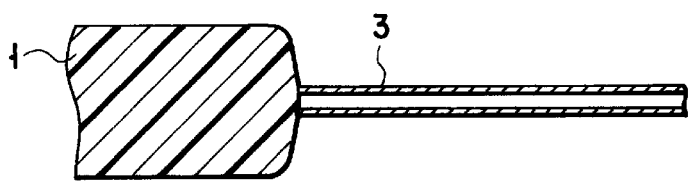
Figure 11C:
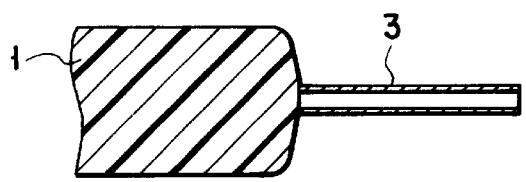
Figure 11D:
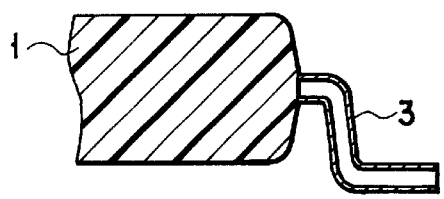
Figure 11E:
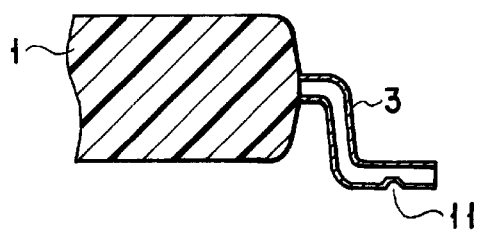
Figure 11F:
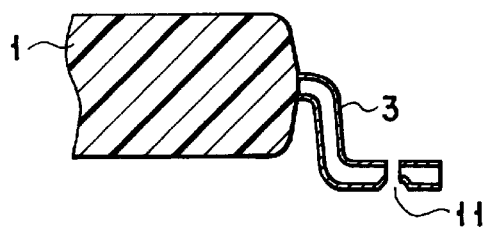

A description will now be given of the fifth embodiment of the present invention with reference to FIGS. 11A to 11F. As shown in FIG. 11A, a structure comprising a semiconductor package 1 and an outer lead 2 is prepared in an ordinary semiconductor device-assembling process. Next, Pd plating, solder plating 3, or the like is provided on the surface of the outer lead 2 by electroplating, as shown in FIG. 11B. The outer lead 2 in this state is preliminarily cut in such a manner that the resultant lead is somewhat longer than the lead of the final product, as shown in FIG. 1C. Subsequently, the lead is bent or worked to have a predetermined shape, as shown in FIG. 11D. A depression 11 is formed in the outer lead 2 by coining or another suitable means, as shown in FIG. 11E. The depression 11 may have a U-shape, a V-shape or any other shape desired. Finally, the lead is cut in such a manner that the depression 11 is located at the distal end of the remaining portion of the lead, as shown in FIG. 11F. The depression 11 can be formed by mechanical working (e.g., coining). The fifth embodiment differs distinctly from the first to fourth embodiments in that the depression 11 is formed after outer leads are shaped like a gull wing. There is no particular restriction on the direction in which the outer leads 2 are cut, but in order to produce sufficient advantages of the present invention, it is preferable that the cutting direction be determined in such a manner that the resultant burrs do not protrude toward the surface of the board.

By use of the fifth embodiment described above, the soldering characteristics are improved, and a solder fillet can be formed at the front and back portions of an outer lead in an optimal manner, thereby improving reliability.

Figure 12:
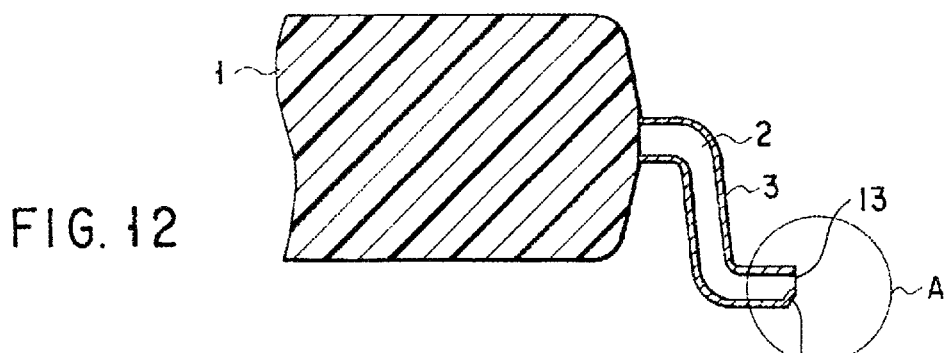
FIG. 12 is a sectional view of a QFP or SOP type semiconductor device according one embodiment of the present invention.
Figure 13:
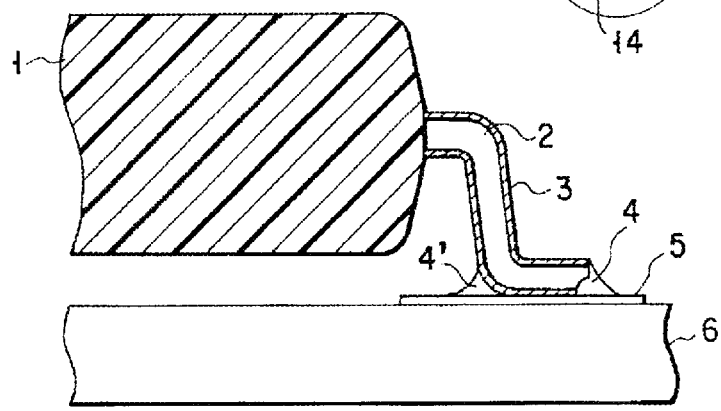
FIG. 13 is a sectional view showing how the QFP or SOP type semiconductor device according to one embodiment of the present invention is mounted on a circuit board.

A lead made according to the semiconductor device-manufacturing method of the present invention has a solder plating layer at the lower half of the cut face, as indicated in portion A of FIG. 12. In the same matter as shown in FIG. 8F, the lead 2 has the distal end, which includes the cut surface 13 approximately perpendicular to the longitudinal direction thereof, which is not covered with the solder plating layer 3, and the sloped surface 14 sloped with respect to the longitudinal direction thereof, which is covered with the solder plating layer 3. Therefore, when the lead 2 is soldered to a conductive layer 5 of a printed circuit board 6, the soldering material rises to a sufficiently high level. That is, the solder layer creeps up or rises along the solder plating layer 3 of the sloped surface 14. As a result, both the front fillet 4 and the back Fillet 4' are large enough to ensure reliability, as shown in FIG. 13.

Figure 14:
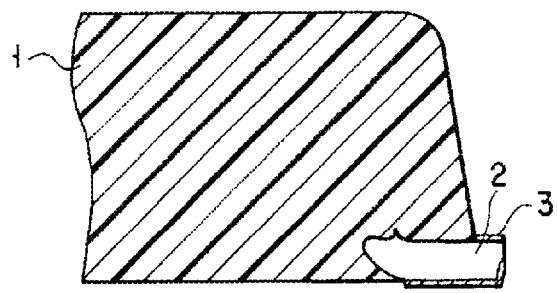
FIG. 14 is a sectional view of a SON type semiconductor device according to one embodiment of the present invention.
Figure 15:
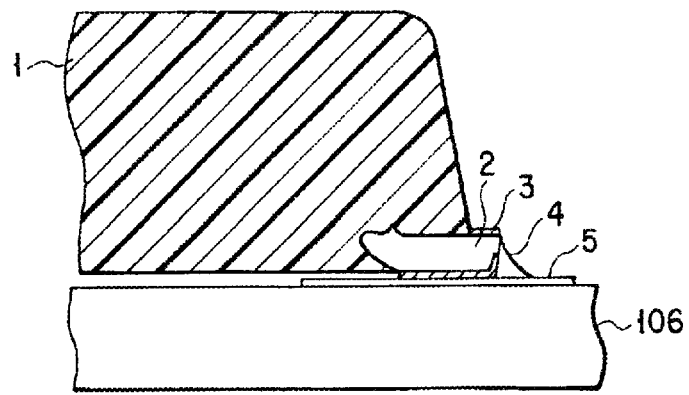
FIG. 15 is a sectional view showing how the SON type semiconductor device according to one embodiment of the present invention is mounted on a circuit board.

FIG. 14 shows a SON type package 1 manufactured according to the present invention and illustrates how an outer lead having a solder plating layer thereon is arranged with reference to the package 1. FIG. 15 shows a state in which the SON type semiconductor device is soldered to a board. In general, when a SON type package is soldered to a board, no back fillet is formed. This means that only the front fillet is related to the physical stability in connection. In the case of the SON type package to which the present invention is applied, however, the front fillet 4 is sufficiently tall. In comparison with the conventional SON type semiconductor device, the SON type semiconductor device according to the present invention is remarkably improved in reliability and is very advantageous when it is reduced to practice.

Figure 16:
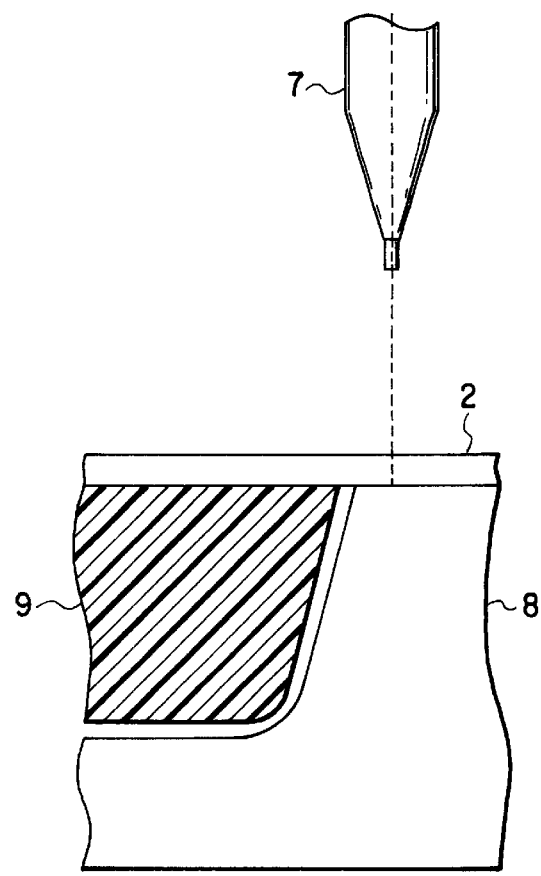
FIG. 16 is a sectional view showing a coining step executed for manufacturing a semiconductor device according to one embodiment of the present invention.

The coining step executed when the present invention is reduced to practice will be described. As shown in FIG. 16, a semiconductor package sealed with a molding resin 9 and having outer leads is placed on a die 8, ad coining is executed by means of a coining punch 7.

The pressing load applied at the time of coining is in the range of 7,000 to 8,000N, for example. The frame having outer leads can be formed of a "42 alloy", which is an alloy consisting of 42% by weight of Ni and 58% by weight of Fe. The thickness of each lead is 0.100 to 0.25 mm, and the thickness of the solder plating layer is 0.01 mm.

Figure 17:
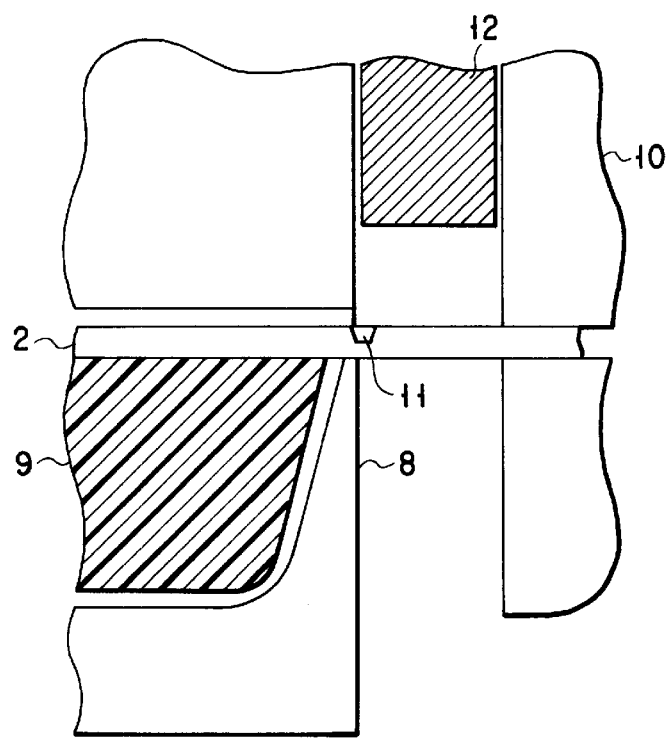
FIG. 17 is a sectional view showing a cutting step in which the distal ends of the leads of the semiconductor device are cut according to one embodiment of the present invention.
Figure 18:
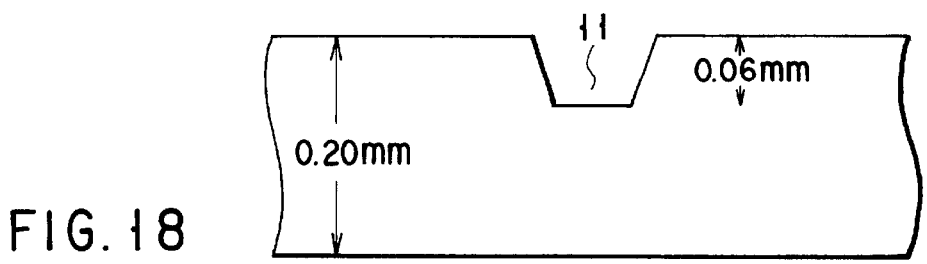
FIG. 18 is a sectional view showing how leads of the semiconductor device according to one embodiment of the present invention are formed in the case where the coining amount is 0.06 mm.

FIG. 17 illustrates a cutting step for cutting off the distal end portion of an outer lead. As shown in FIG. 17, the outer lead is fixed by means of die 8 and a stripper 10, and a cutting punch 12 is moved down to the depression 11 of the outer lead. As a result, the lead 2 is cut at the position where the depression 11 is formed.

FIGS. 18–20, 21A–21B and 22A–22B show how the sections of 0.20 mm-thick leads look like when they are subjected to coining, with different coining amounts being set. When the coining amount is 0.06 mm, the depression 11 does not reach the central portion of the lead, as indicated in the sectional view shown in FIG. 18. When the coining amount is 0.10 mm, the depression 11 nearly reaches the central portion of the lead, as indicated in the sectional view shown in FIG. 19. When the coining amount is 0.12 mm, the depression 11 reaches a region deeper than the central portion of the lead, as indicated in the sectional view shown in FIG. 20. These leads are coated with a solder plating layer and then cut at the portions where depressions 11 are formed. FIGS. 21A–21B and 22A–22B show how the solder fillets rise when the leads are soldered to a circuit board. It should be noted that the leads shown in FIGS. 21A–21B and 22A–22B are reverse in direction to those shown in FIGS. 18–20. (The upper portions shown in FIGS. 21A–21B and 22A–22B is depicted as being lower in FIGS. 18–20.)

Figure 19:
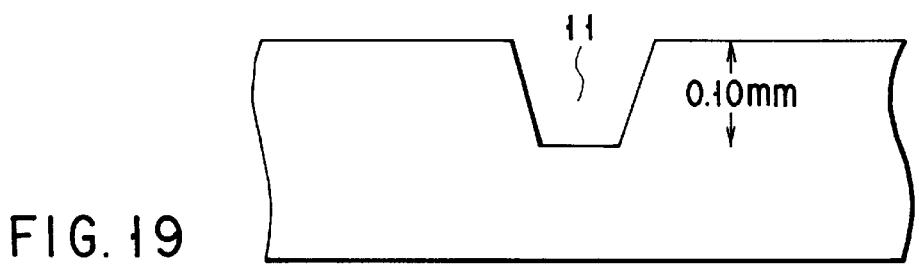
FIG. 19 is a sectional view showing how leads of the semiconductor device according to one embodiment of the present invention are formed in the case where the coining amount is 0.10 mm.
Figure 20:
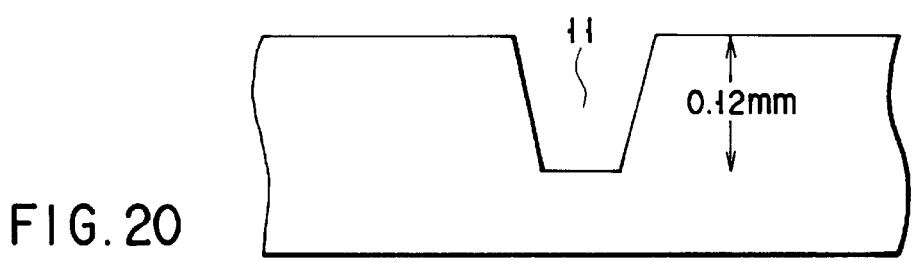
FIG. 20 is a sectional view showing how leads of the semiconductor device according to one embodiment of the present invention are formed in the case where the coining amount is 0.12 mm.
Figures 21A, 21B:
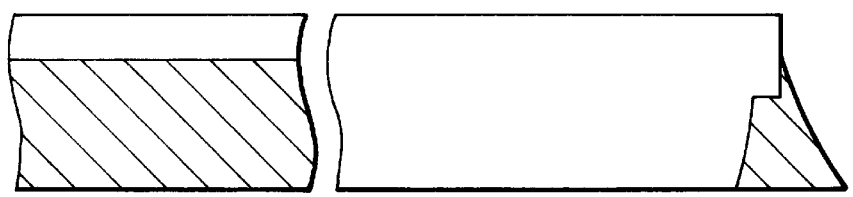
FIGS. 21A and 21B are sectional views showing leads of the semiconductor device according to one embodiment of the present invention are in the case where the coining amount is 0.10 mm.
Figures 22A, 22B:
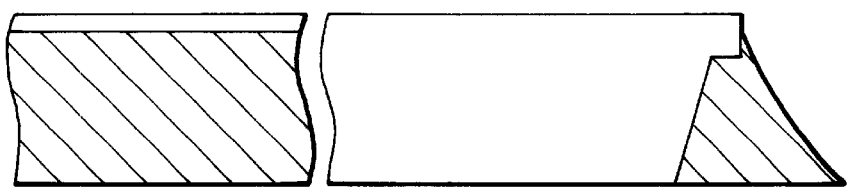
FIGS. 22A and 22B are sectional views showing leads of the semiconductor device according to one embodiment of the present invention are in the case where the coining amount is 0.12 mm.

FIG. 21A shows how the soldering characteristic at the cut face of the lead is when the coining amount is 0.10 mm (FIG. 19). As shown in FIG. 21A, the solder fillet rises to a position higher than center of the lead. FIG. 21B is a sectional view of the cut end portion of the lead and shows how the solder fillet rises. Where the solder fillet rises to a position higher than the center of the lead, the amount of soldering material is considered sufficient. FIG. 21A shows how the soldering characteristic is when the coining amount is 0.12 mm. In this case, the solder fillet rises to a position corresponding to $9/10$ of the height of the thickness of the lead. FIG. 21B is a sectional view of the cut end portion of the lead and shows how the solder fillet rises. When the coining amount is 0.12 mm (FIG. 20), the solder fillet rises to a position which is almost the same level as the top of the lead.

As can be seen from the above, the coining amount should be large so as to allow the solder fillet to rise to a high position. At the same time, however, the coining amount should not be excessively large, in view of the following points:

(1) If the coining amount is too large, the lead is likely to break. To say the least of it, an excessive increase in the coining amount is not suitable in practice.

(2) If the coining amount is too large, the lead is extended too much at the coined portion, resulting in the deformation of the frame. The inventors conducted experiments with respect to this phenomenon and confirmed that the phenomenon was not be observed as long as the depth of a depression was less than 75% of the thickness at the distal end face of an outer lead.

When the coining amount is more than 0.06 mm (which is 30% of the thickness of a lead), a sufficient fillet can be formed at the distal end of the lead. The inventors also confirmed this fact by experiment. If more remarkable advantages are desired, it is preferable that the coining amount be larger than 0.10 mm (which is 50% of the thickness of the lead). As can be seen from this, an optimal solder fillet can be formed when the coining amount is within a certain range.

To improve the soldering characteristics, the depressions may be coated with one material selected from the group including Sn—Pb, Sn—Ag, Sn—Bi, Sn—Zn, Sn—Cu, Pd, Au and Ag. Each depression may be U-shaped, V-shaped or rectangular. The depth of each depression is preferably within the range of 30% to 75% with respect to the thickness of the outer lead at the cut end face of the distal end. As long as the depth of the depression is within that range, an optimal solder fillet can be formed at the distal end of the lead, the lead is preventing from breaking, and the extension of the lead at the coined portion does not result in frame deformation. The outer leads may be either a gull-wing type or a straight type. The outer leads may be provided with an outer sheath by executing one of electrolytic plating, electroless plating, hot dipping and deposition.

As described above, according to the present invention, a solder fillet of sufficient size can be formed on the outer leads when they are soldered to a circuit board, and the bonding strength of the leads is increased. In the prior art, a SON type package is restricted in use because a desirable solder fillet cannot be formed. According to the present invention, however, even the SON type package can be used without any problems, and the reliability has increased, accordingly.

In addition, since a solder fillet of suitable size can be formed, the adjacent lines are prevented from short-circuiting, due to an excessive amount of soldering material. Moreover, the inspection after the soldering step can be easily executed, so that both the inspection efficiency and the inspection accuracy can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a package for sealing a semiconductor chip; and
   outer leads extending from said package,
   wherein each of said outer leads has a distal end including a first surface approximately perpendicular to a longitudinal direction of each of said outer leads and a second surface sloped with respect to said longitudinal direction of said outer lead, and
   wherein each of said outer leads is covered with a solder plating layer except for said first surface.

2. The semiconductor device according to claim 1, wherein said first surface is continuous with said second surface.

3. The semiconductor device according to claim 1, wherein said second surface has a curved slope.

4. The semiconductor device according to claim 1, wherein said first surface is a cut surface.

5. The semiconductor device according to claim 1, wherein said distal end has a stepped structure formed by said first and second surfaces.

* * * * *